(12) United States Patent
Inaba et al.

(10) Patent No.: US 11,804,766 B2
(45) Date of Patent: Oct. 31, 2023

(54) LINEAR HEAD MODULE

(71) Applicant: SANYO DENKI CO., LTD., Tokyo (JP)

(72) Inventors: Satoshi Inaba, Tokyo (JP); Yuki Onda, Tokyo (JP); Yasushi Misawa, Tokyo (JP)

(73) Assignee: SANYO DENKI CO., LTD., Tokyo (JP)

( * ) Notice: Subject to any disclaimer, the term of this patent is extended or adjusted under 35 U.S.C. 154(b) by 8 days.

(21) Appl. No.: 17/740,469

(22) Filed: May 10, 2022

(65) Prior Publication Data

US 2022/0399792 A1 Dec. 15, 2022

(30) Foreign Application Priority Data

Jun. 11, 2021 (JP) .................... 2021-098054

(51) Int. Cl.
*H02K 41/03* (2006.01)
*H05K 13/04* (2006.01)
*H02K 33/18* (2006.01)
*H02K 5/16* (2006.01)

(52) U.S. Cl.
CPC ............. *H02K 41/031* (2013.01); *H02K 5/16* (2013.01); *H02K 33/18* (2013.01); *H05K 13/04* (2013.01)

(58) Field of Classification Search
CPC ...... H02K 41/031; H02K 41/03; H02K 33/18; H02K 33/16; H02K 35/02; H02K 5/161; H02K 7/083; H02K 2213/06; H05K 13/04; H05K 13/0406
USPC ................................ 310/12.02, 12.27, 12.31
See application file for complete search history.

(56) References Cited

U.S. PATENT DOCUMENTS

| | | | | |
|---|---|---|---|---|
| 5,418,413 A | * | 5/1995 | Satomi | .................... H02K 41/03 310/12.22 |
| 5,603,155 A | * | 2/1997 | Satomi | ................. H02K 41/031 29/598 |
| 2008/0309260 A1 | * | 12/2008 | Kanai | .................... H02P 25/066 318/135 |
| 2011/0156499 A1 | * | 6/2011 | Tang | .................... H02K 41/031 310/12.18 |

(Continued)

FOREIGN PATENT DOCUMENTS

EP          2541745 A2    1/2013
JP       2007-142359 A    6/2007

(Continued)

OTHER PUBLICATIONS

Machine translation of JP-2007142359-A. (Year: 2007).*
Extended European Search Report (EESR) dated Oct. 28, 2022 for European Patent Application No. 22173004.7.

*Primary Examiner* — Michael Andrews
(74) *Attorney, Agent, or Firm* — Rankin, Hill & Clark LLP (57) ABSTRACT

A linear head module includes a plurality of linear units each having an output member, and a housing. The linear unit has a mover and a stator. The stator has an output-side bearing holder and a counter-output-side bearing holder. The housing has: a main body portion integrally including an output-side surface portion, a counter-output-side surface portion, and a coupling portion that couples the output-side surface portion and the counter-output-side surface portion; a flange facing the output-side surface portion; and a bracket facing the counter-output-side surface portion.

6 Claims, 5 Drawing Sheets

(56) References Cited

U.S. PATENT DOCUMENTS

| | | | | |
|---|---|---|---|---|
| 2012/0326537 A1* | 12/2012 | Tang | ...................... | H02K 35/02 |
| | | | | 310/30 |
| 2015/0084441 A1* | 3/2015 | Tang | ........................ | H02K 9/02 |
| | | | | 310/12.14 |
| 2022/0399793 A1* | 12/2022 | Inaba | ...................... | H02K 11/21 |
| 2022/0399794 A1* | 12/2022 | Inaba | ...................... | H02K 11/21 |

FOREIGN PATENT DOCUMENTS

| JP | 2007142359 A | * | 6/2007 | ............. H05K 13/04 |
|---|---|---|---|---|
| JP | 2008-253117 A | | 10/2008 | |
| JP | 4385406 B2 | | 12/2009 | |
| JP | 5276299 B2 | | 8/2013 | |

\* cited by examiner

LINEAR HEAD MODULE

CROSS-REFERENCE TO RELATED APPLICATION

This application is based on Japanese Patent Application No. 2021-098054 filed with the Japan Patent Office on Jun. 11, 2021, the entire content of which is hereby incorporated by reference.

BACKGROUND

1. Technical Field

One aspect of the present disclosure relates to a linear head module.

2. Related Art

A linear head module described in Japanese Patent No. 4385406 is known.

SUMMARY

A linear head module includes: a plurality of linear units each including an output member that moves in a direction of thrust; and a housing configured to hold the plurality of linear units. The linear unit includes: a mover having the output member extending in the direction of thrust, and a magnet; and a stator having a back yoke extending along the output member, and a coil. The stator includes: an output-side bearing holder at an output-side end portion of the back yoke, the output-side bearing holder having a bearing that supports the output member in such a manner as to be movable in the direction of thrust; and a counter-output-side bearing holder at a counter-output-side end portion of the back yoke, the counter-output-side bearing holder having a bearing that supports the output member in such a manner as to be movable in the direction of thrust. The housing includes: a main body portion integrally having an output-side surface portion including a plurality of first through-holes, through each of which the respective output-side bearing holder is inserted, a counter-output-side surface portion including a plurality of second through-holes, through each of which the respective counter-output-side bearing holder is inserted, and a coupling portion that couples the output-side surface portion and the counter-output-side surface portion; a flange facing the output-side surface portion to support an output-side end portion of each of the output-side bearing holders; and a bracket facing the counter-output-side surface portion to support a counter-output-side end portion of each of the counter-output-side bearing holders.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the linear head module described in Japanese Patent No. 4385406, pipes of a plurality of linear motors are integrated into one, sandwiched between a frame and a cover. In the linear head module of Japanese Patent No. 4385406, an output-side portion and a counter-output-side portion of a lower part of the frame are integrated. Hence, it is easy to position the output-side end portion and the counter-output-side end portion of the pipe and to assemble the linear head module. However, the present inventors have realized that in the linear head module, there is room for a reduction in the number of components in addition to maintaining the ease of assembly.

One object of the present disclosure is to provide a linear head module that is easy to assemble and includes a small number of components.

A linear head module according to one aspect of the present disclosure (the present linear head module) includes: a plurality of linear units each including an output member that moves in a direction of thrust; and a housing configured to hold the plurality of linear units. The linear unit includes: a mover having the output member extending in the direction of thrust, and a magnet; and a stator having a back yoke extending along the output member, and a coil. The stator includes: an output-side bearing holder at an output-side end portion of the back yoke, the output-side bearing holder having a bearing that supports the output member in such a manner as to be movable in the direction of thrust; and a counter-output-side bearing holder at a counter-output-side end portion of the back yoke, the counter-output-side bearing holder having a bearing that supports the output member in such a manner as to be movable in the direction of thrust. The housing includes: a main body portion integrally having an output-side surface portion including a plurality of first through-holes, through each of which the respective output-side bearing holder is inserted, a counter-output-side surface portion including a plurality of second through-holes, through each of which the respective counter-output-side bearing holder is inserted, and a coupling portion that couples the output-side surface portion and the counter-output-side surface portion; a flange facing the output-side surface portion to support an output-side end portion of each of the output-side bearing holders; and a bracket facing the counter-output-side surface portion to support a counter-output-side end portion of each of the counter-output-side bearing holders.

The present linear head module is a linear head module that is easy to assemble and includes a small number of components.

An embodiment of the present disclosure is described hereinafter with reference to the drawings. Descriptions of members having the same reference numerals as members that have already been described in the detailed description are omitted for the convenience of description. Moreover, the dimensions of each member illustrated in the drawings may be different from actual dimensions thereof for the convenience of description.

Figure 1:
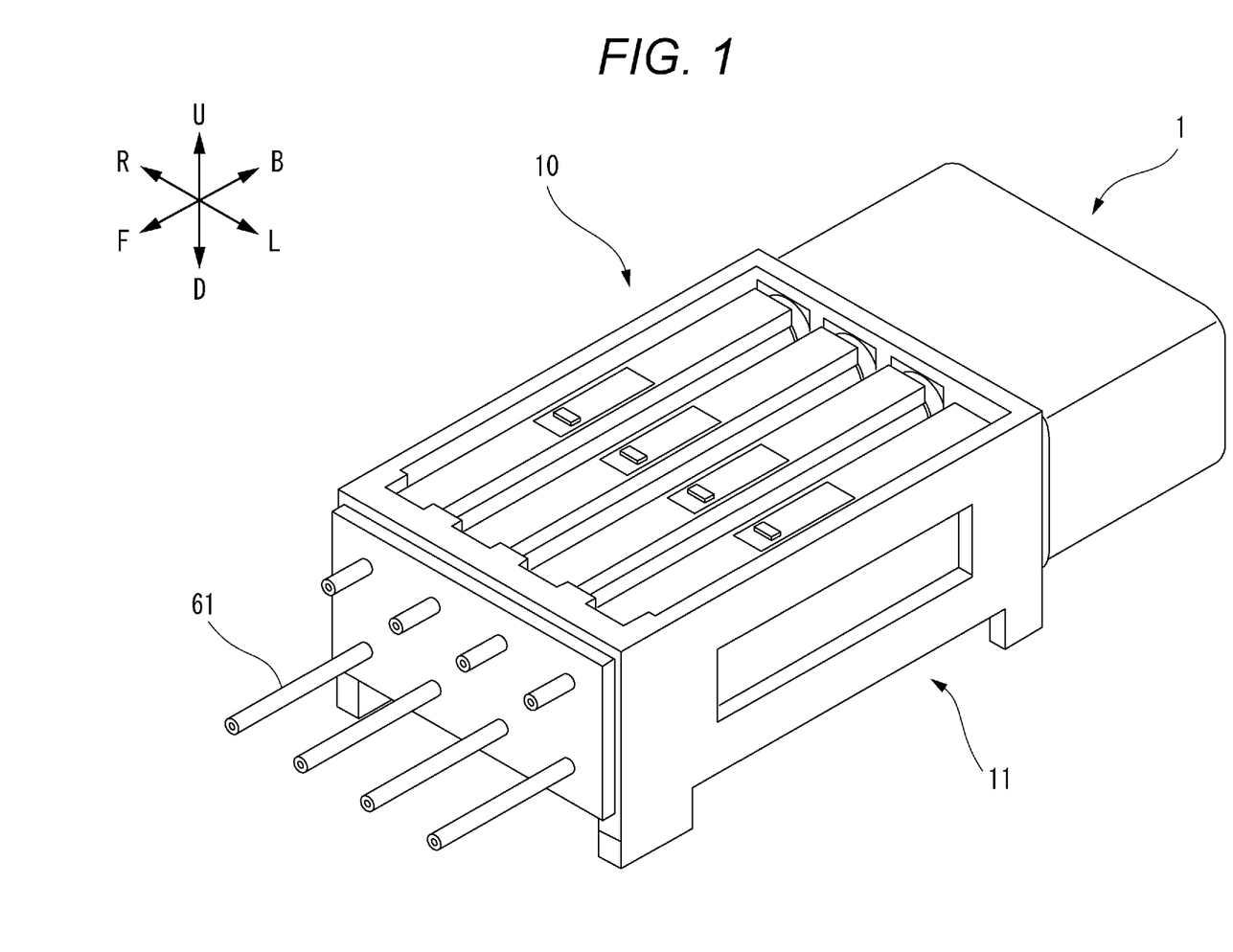
FIG. 1 is a perspective view of a linear head module according to an embodiment of the present disclosure.

FIG. 1 is a perspective view of a linear head module 1 according to the embodiment of the present disclosure. In FIG. 1, a reference sign F indicates front, a reference sign B back, a reference sign U up, a reference sign D down, a reference sign R right, and a reference sign L left.

In the following description, the "left-and-right direction", the "front-and-back direction", and the "up-and-down direction" are mentioned as appropriate for the convenience of description. The "up-and-down direction" is a direction including the "upward direction" and the "downward direction." The "front-and-back direction" is a direction including the "forward direction" and the "backward direction". The "left-and-right direction" is a direction including the "leftward direction" and the "rightward direction". In the following description, the direction of thrust in the linear head module 1 is referred to as the front-and-back direction.

As illustrated in FIG. 1, the linear head module 1 includes a plurality of linear units 10 each including an output member 61 that moves in the front-and-back direction (the direction of thrust), and a housing 11 that holds the plurality of linear units 10. The output member 61 can move in the front-and-back direction. In the illustrated example, the linear head module 1 includes eight linear units 10. Four linear units 10 are arranged in the left-and-right direction in the upper row. Four linear units 10 are arranged in the left-and-right direction in the lower row.

Figure 2:
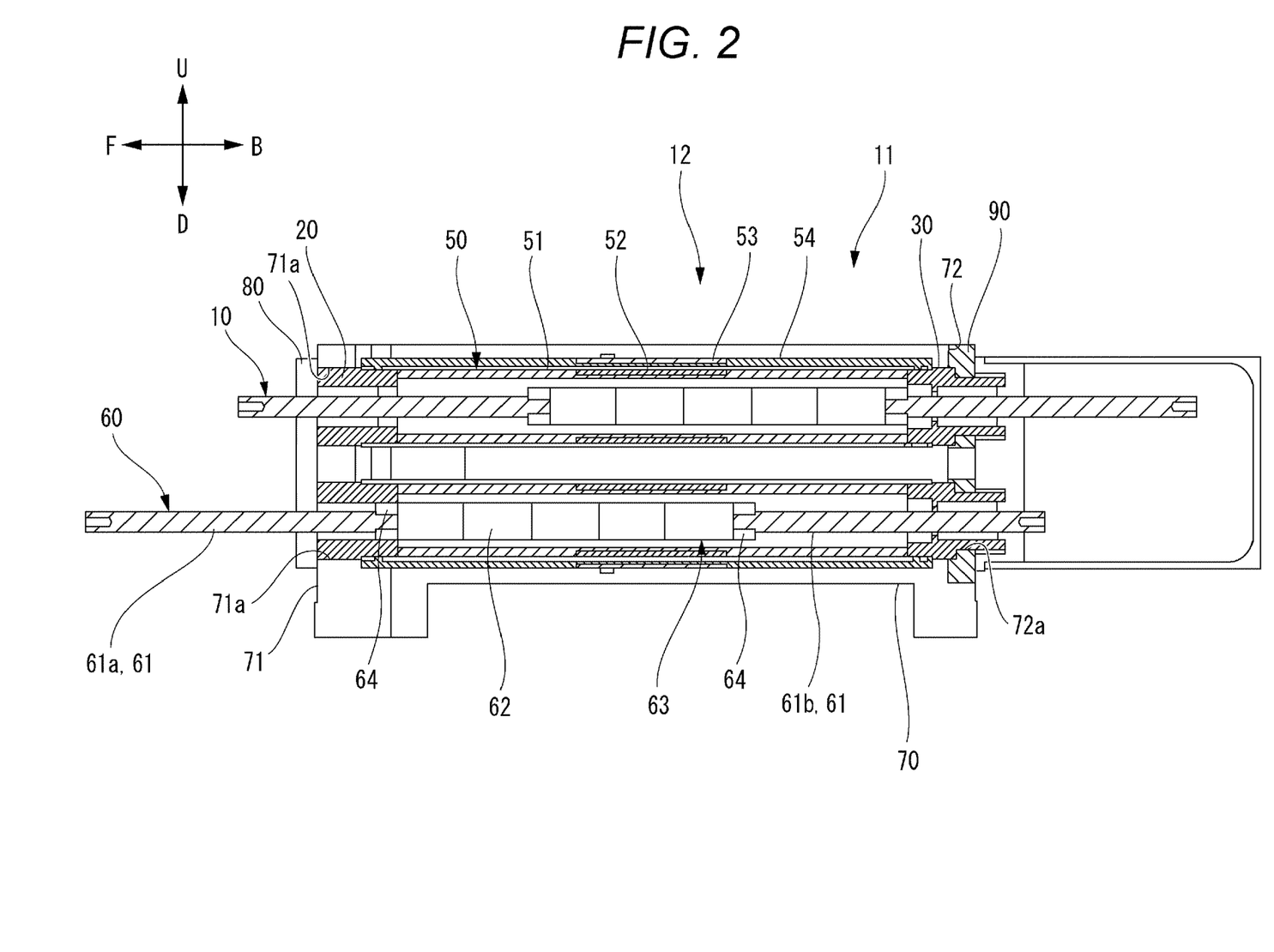
FIG. 2 is a cross-sectional view of the linear head module.

FIG. 2 is a cross-sectional view of the linear head module 1. FIG. 2 is a diagram of the linear head module 1 as viewed in cross section that extends in the front-and-back direction and in the up-and-down direction. As illustrated in FIG. 2, each of the linear units 10 includes a stator 50 fixed to the housing 11, and a mover 60 that can move relative to the stator 50 in the front-and-back direction.

The mover 60 includes the output member 61 extending in the front-and-back direction, and magnets 62. The plurality of magnets 62 is arranged in a line in the front-and-back direction, and is coupled to one another. The output member 61 is a rod-shaped member extending in the front-and-back direction. The output member 61 includes a front output bar 61a provided forward of the magnets 62, and a back output bar 61b provided backward of the magnets 62. A front part of the front output bar 61a is connected to a drive target object that is desired to be driven by the linear head module 1.

The stator 50 includes a back yoke 51 and coils 52. In the illustrated example, the stator 50 further includes a board 53 that supplies power to the coils 52 and controls the coils 52, and a cover 54 where the board 53 is housed. The stator 50 is fixed to the housing 11.

The back yoke 51 is a member mainly including a magnetic material such as iron. In the illustrated example, the back yoke 51 is a cylindrical member extending along the output member 61. The output member 61 is housed in the cylindrical back yoke 51 in such a manner as to be movable in the front-and-back direction. Moreover, the plurality of coils 52 is provided in the cylindrical (cylinder type) back yoke 51. The coil 52 is formed by winding an electric wire into a shape of a tube centered around an axis extending in the front-and-back direction. The back yoke 51 causes lines of magnetic flux generated by the coil 52 to converge, and increases magnetic force.

As illustrated in FIG. 2 (and FIG. 4), the mover 60 includes a cylindrical magnet holder 63. The plurality of magnets 62 is provided in the magnet holder 63. The magnet holder 63 is provided on an inner peripheral side of the cylindrical back yoke 51 in such a manner as to be movable relative to the back yoke 51 in the front-and-back direction. A magnet retaining member 64 is provided at each of front and back ends of the magnet holder 63. In other words, the magnet retaining members 64 are located at front and back ends of the plurality of magnets 62 arranged in the front-and-back direction. The magnet retaining members 64 are each provided with a press-fit hole. A back end of the front output bar 61a is press-fitted in the press-fit hole of the magnet retaining member 64 provided at the front end of the magnet holder 63. A front end of the back output bar 61b is press-fitted in the press-fit hole of the magnet retaining member 64 provided at the back end of the magnet holder 63.

An electric wire extending from a power supply (neither is illustrated) is connected to the board 53. The board 53 is housed in the plate-shaped cover 54 that is provided on an outer peripheral side of the cylindrical back yoke 51 to house the board 53. An electric wire extends from the board 53 to the coil 52. The board 53 supplies power to the coil 52 via the electric wire. The board 53 controls the direction of flow of and the amount of current to be supplied to the coil 52. Therefore, the direction and strength of magnetic lines of force generated around the coil 52 are controlled. Consequently, the board 53 controls the direction and speed of the movement of the output member 61.

Figure 3:
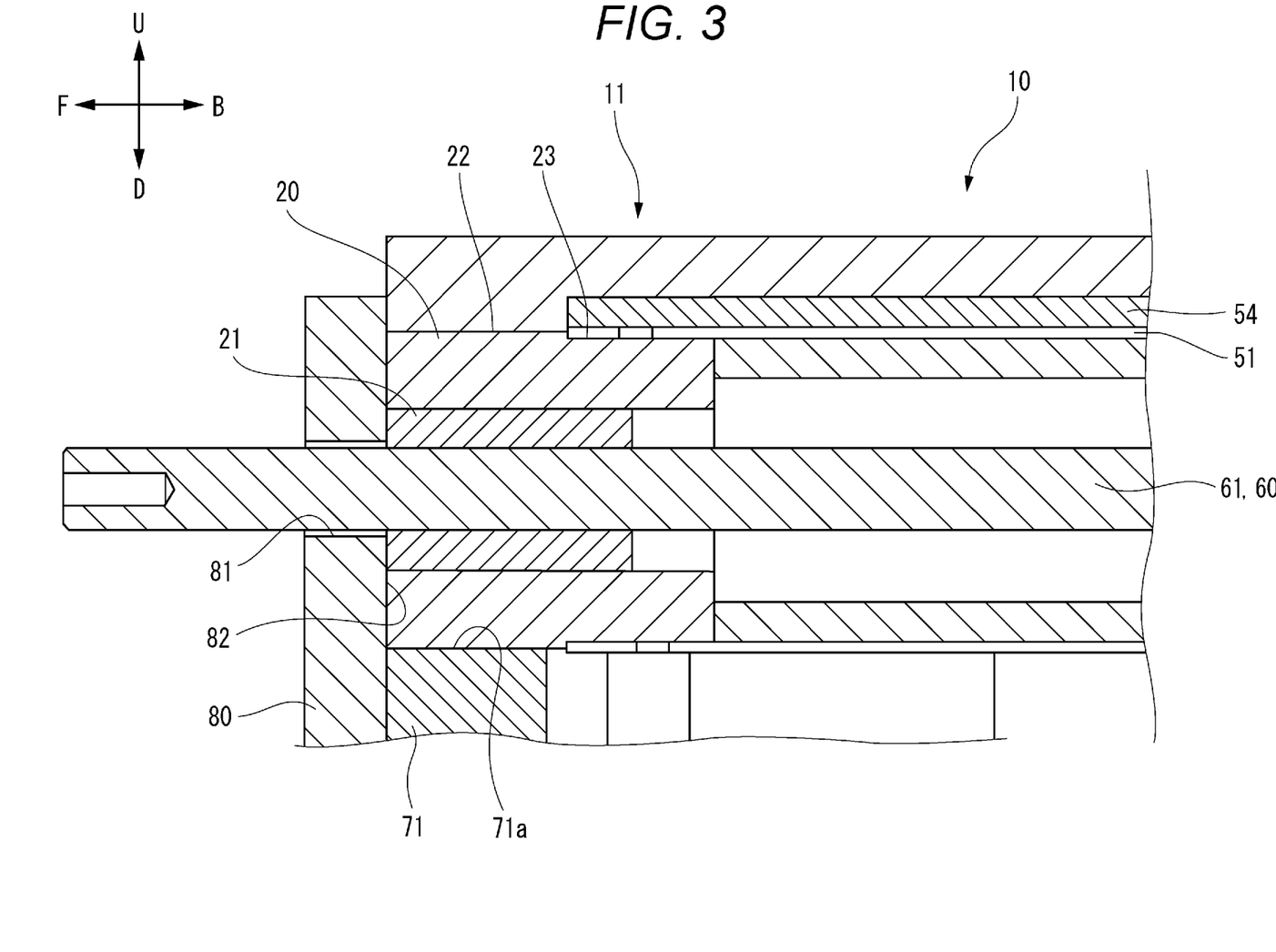
FIG. 3 is an enlarged view of an output-side end portion of a linear unit.

FIG. 3 is an enlarged view of an output-side end portion of the linear unit 10 illustrated in FIG. 2. As illustrated in FIG. 3, the stator 50 includes a first bearing holder 20 (an output-side bearing holder). The first bearing holder 20 is attached to the housing 11, and supports an output-side end portion of the back yoke 51 of the stator 50. The first bearing holder 20 is provided to the output-side end portion of the back yoke 51. The first bearing holder 20 includes a first bearing 21 that supports the output member 61 in such a manner as to be movable in the front-and-back direction.

Figure 4:
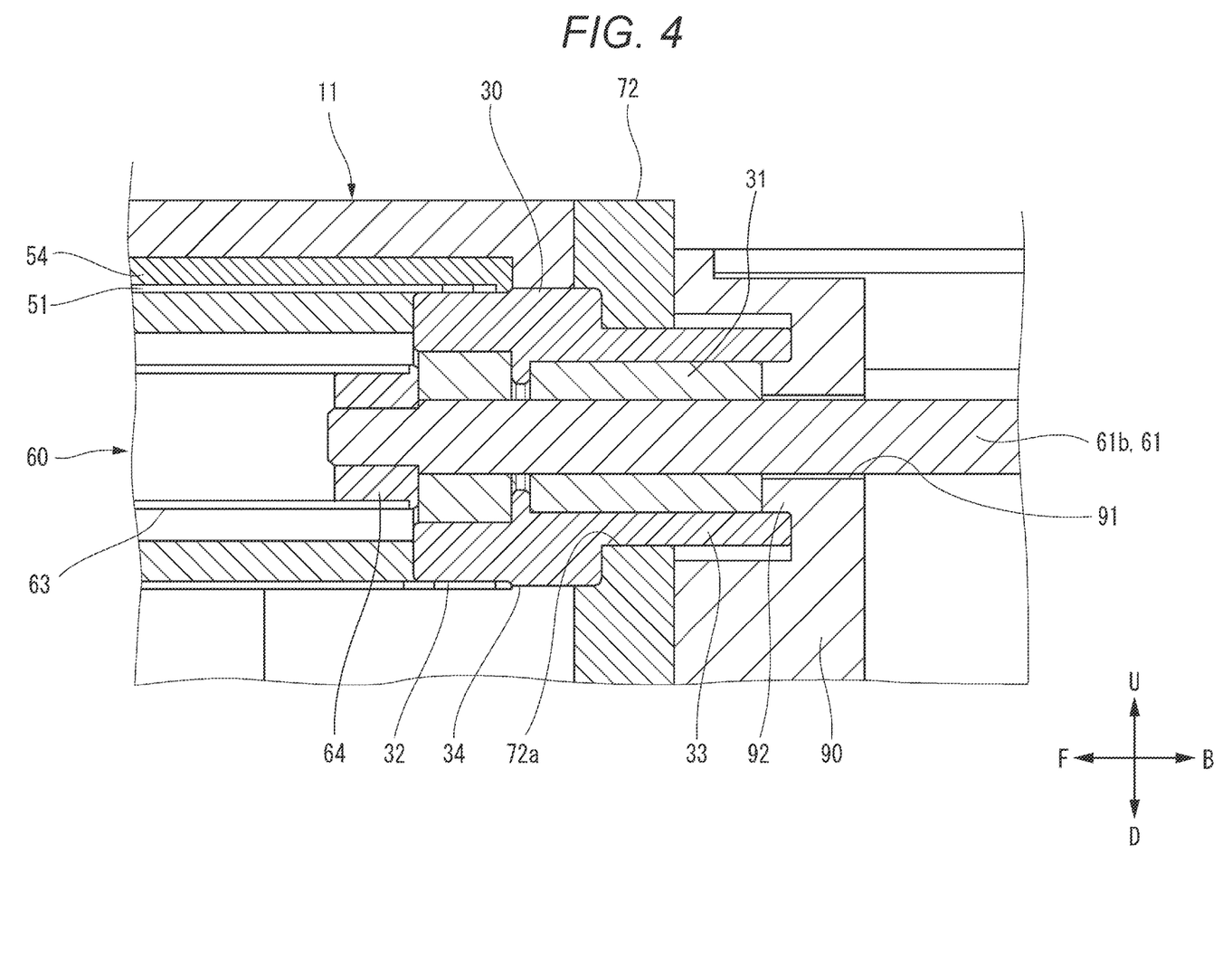
FIG. 4 is an enlarged view of a counter-output-side end portion of the linear unit.

FIG. 4 is an enlarged view of a counter-output-side end portion of the linear unit 10 illustrated in FIG. 2. As illustrated in FIG. 4, the stator 50 includes a second bearing holder 30 (a counter-output-side bearing holder). The second bearing holder 30 is attached to the housing 11, and supports a counter-output-side end portion of the back yoke 51 of the stator 50. The second bearing holder 30 is provided to the counter-output-side end portion of the back yoke 51. The second bearing holder 30 includes a second bearing 31 that supports the output member 61 in such a manner as to be movable in the front-and-back direction.

Figure 5:
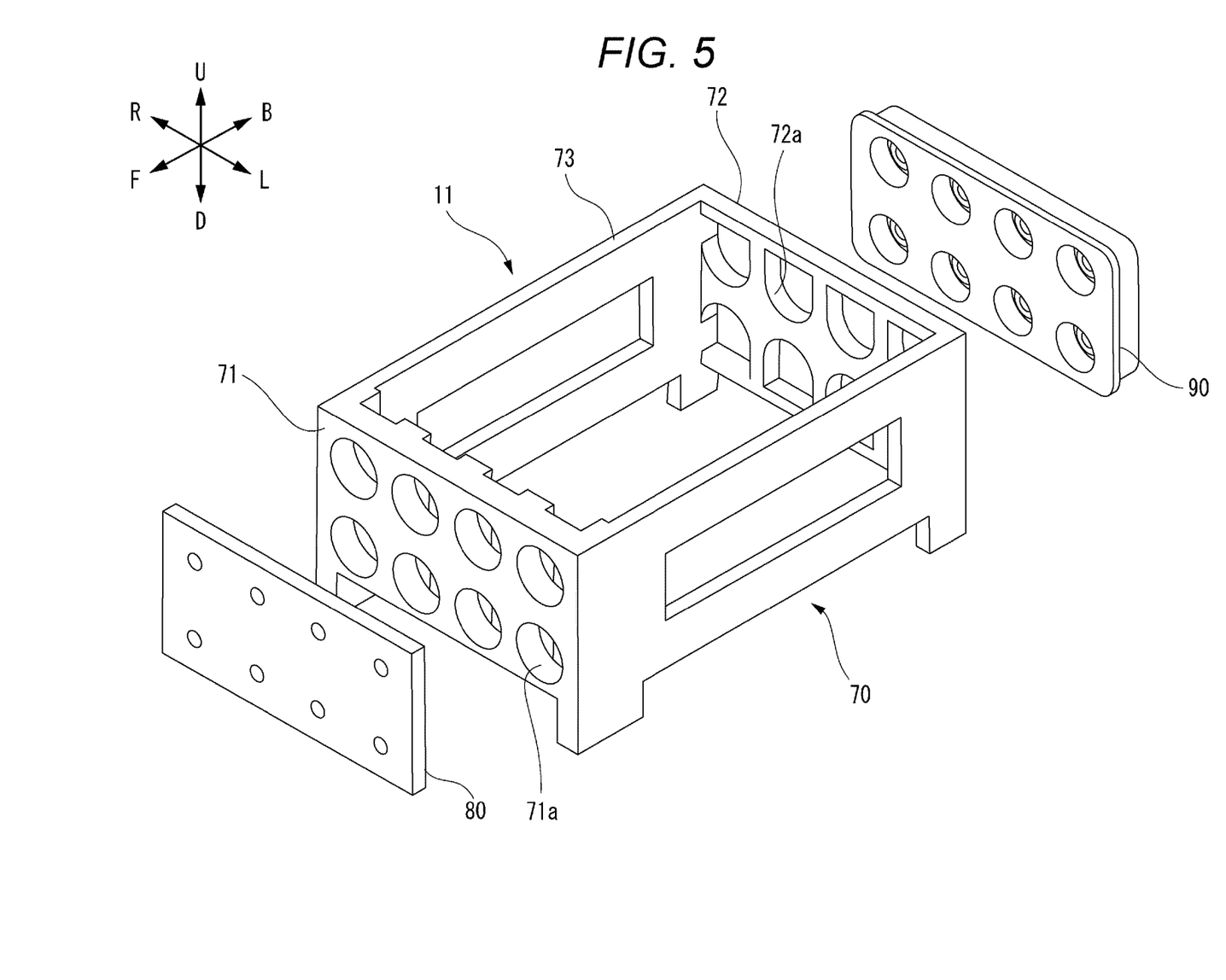
FIG. 5 is an exploded perspective view of a housing.

FIG. 5 is an exploded perspective view of the housing 11. The housing 11 holds the plurality of linear units 10. As illustrated in FIG. 5, the housing 11 includes a main body portion 70, a flange 80, and a bracket 90.

The main body portion 70 is a frame-shaped member integrally including an output-side surface portion 71, a counter-output-side surface portion 72, and a coupling portion 73.

The output-side surface portion 71 is a portion forming a surface of the main body portion 70 on the output side. The output-side surface portion 71 is provided with a plurality of first through-holes 71a. The counter-output-side surface portion 72 is a portion forming a surface of the main body portion 70 on the counter-output side. The counter-output-side surface portion 72 is provided with a plurality of second through-holes 72a. The output-side surface portion 71 and the counter-output-side surface portion 72 stretch in the up-and-down direction and in the left-and-right direction.

The coupling portion 73 is a portion coupling the output-side surface portion 71 and the counter-output-side surface portion 72. The coupling portion 73 includes a pair of side surface portions extending in the front-and-back direction and in the up-and-down direction.

Return to FIG. 2. The linear unit 10 penetrates the main body portion 70 in the front-and-back direction. The first bearing holder 20 of the linear unit 10 protrudes forward from the main body portion 70. A front end of the linear unit 10 penetrates the first through-hole 71a of the output-side surface portion 71. The first bearing holder 20 is inserted through the first through-hole 71a.

The second bearing holder 30 of the linear unit 10 protrudes backward from the main body portion 70. A back end of the linear unit 10 penetrates the second through-hole 72a of the counter-output-side surface portion 72. The second bearing holder 30 is inserted through the second through-hole 72a.

The flange 80 is a plate-shaped member that is placed in such a manner as to face the output-side surface portion 71. The flange 80 supports an output-side end portion of each of the first bearing holders 20. The flange 80 retains the stators 50 in such a manner as to prevent the stators 50 from coming out of the main body portion 70 to the output side.

The bracket 90 faces the counter-output-side surface portion 72 and supports a counter-output-side end portion of each of the second bearing holders 30. The bracket 90 retains the stators 50 in such a manner as to restrain the stators 50 from coming out of the main body portion 70 to the counter-output side.

The main body portion 70 of the housing 11 supports an intermediate portion of the linear unit 10. The flange 80 restrains the linear units 10 from coming forward out of the main body portion 70. The bracket 90 restrains the linear units 10 from coming backward of the main body portion 70.

According to the linear head module 1 of the embodiment, the housing 11 holds all the plurality of linear units 10 together. Hence, it is easier to assemble the linear head module 1, as compared to a structure where the plurality of linear units 10 is assembled to the linear head module 1.

Moreover, three portions, that is, the output-side surface portion 71, the counter-output-side surface portion 72, and the coupling portion 73, are integrated into one unit to form the main body portion 70 of the housing 11. Furthermore, the housing 11 can be formed of three components: the main body portion 70, the flange 80, and the bracket 90. Hence, the linear head module 1 can be formed of a small number of components.

Moreover, as illustrated in FIG. 3, in the linear head module 1 of the embodiment, the flange 80 is provided with first insertion holes 81 through each of which the output member 61 is inserted, and a contact portion 82 with which an output-side end surface of each of the first bearing holders 20 comes into contact.

The output-side end surface of the first bearing holder 20 is brought into contact with the contact portion 82, which enables easily and accurately determining the position of the linear unit 10 in the front-and-back direction.

Moreover, as illustrated in FIG. 3, in the linear head module 1 of the embodiment, the first bearing holder 20 includes a first large-diameter portion 22 provided on a front side thereof and a first small-diameter portion 23 that has a smaller diameter than the first large-diameter portion 22 and is provided on a back side of the first bearing holder 20. The first large-diameter portion 22 is fitted in the first through-hole 71a of the output-side surface portion 71 of the housing 11. The first small-diameter portion 23 is fitted in a front end portion of the back yoke 51.

The first small-diameter portion 23 is coupled to the back yoke 51, and the first large-diameter portion 22 is fitted in the first through-hole 71a of the output-side surface portion 71. Consequently, the position of the linear unit 10 in the in-plane direction orthogonal to the front-and-back direction can be determined easily and accurately.

As illustrated in FIG. 4, the second bearing holder 30 includes a back yoke coupling portion 32 provided on a front side thereof, a second small-diameter portion 33 provided on a back side thereof, and a second large-diameter portion 34 provided between the back yoke coupling portion 32 and the second small-diameter portion 33. The second large-diameter portion 34 has a larger diameter than the second small-diameter portion 33. The back yoke coupling portion 32 is inserted in a back end portion of the back yoke 51.

The bracket 90 is provided with second insertion holes 91, each of which the back output bar 61b of the mover 60 penetrates. A radially inner end portion of a wall surface forming the second insertion hole 91 is provided with a fitting portion 92 extending toward the output side. An outer peripheral surface of the fitting portion 92 fits on an inner peripheral surface of a distal end of the second small-diameter portion 33 of the second bearing holder 30 that extends toward the counter-output side through the second through-hole 72a of the counter-output-side surface portion 72.

The fitting portion 92 of the bracket 90 fits on the second small-diameter portion 33 of the second bearing holder 30, which enables easily and accurately determining the position of the linear unit 10 in the in-plane direction orthogonal to the front-and-back direction.

As illustrated in FIG. 2, the stator 50 includes the coils 52, the board 53 that supplies power to the coils 52 and controls the coils 52, the cylindrical back yoke 51 where the coils 52 are housed, and the plate-shaped cover 54. The plate-shaped cover 54 is provided on the outer peripheral side of the cylindrical back yoke 51, and houses the board 53.

As illustrated in FIG. 5, the first through-hole 71a of the output-side surface portion 71 has a circular shape that allows the cylindrical first bearing holder 20 to be inserted therethrough. The second through-hole 72a of the counter-output-side surface portion 72 has a shape that allows the back yoke 51 and the cover 54 to be inserted therethrough. In the illustrated example, the second through-hole 72a has a shape formed by coupling a rectangular upper part and a circular lower part.

The counter-output-side end portion of the linear unit 10 is inserted into the second through-hole 72a first, and then the output-side end portion of the linear unit 10 is inserted into the first through-hole 71a. Consequently, the linear head module 1 can be easily assembled.

Up to this point the embodiment of the present disclosure has been described. In terms of this, it is needless to say that the technical scope of the present disclosure should not be construed in a limited manner by the description of the embodiment. The embodiment is a mere example. Those skilled in the art understand that various embodiments can be modified in various manners within the technical scope of the present disclosure described in the claims. The technical scope of the present disclosure should be determined on the basis of the scope described in the claims and the scope of equivalents thereof.

In the above-mentioned embodiment, the cylindrical magnetic material has been described. In terms of this, the shape of the magnetic material is not limited to a cylinder. The shape of the magnetic material may be, for example, a rectangular prism or plate.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A linear head module comprising:
   a plurality of linear units each including an output member that moves in a direction of thrust; and
   a housing configured to hold the plurality of linear units, wherein
   the linear unit includes:
      a mover having the output member extending in the direction of thrust, and a magnet; and
      a stator having a back yoke extending along the output member, and a coil,
   the stator includes:
      an output-side bearing holder at an output-side end portion of the back yoke, the output-side bearing holder having a bearing that supports the output member in such a manner as to be movable in the direction of thrust; and
      a counter-output-side bearing holder at a counter-output-side end portion of the back yoke, the counter-output-side bearing holder having a bearing that supports the output member in such a manner as to be movable in the direction of thrust, and
   the housing includes:
      a main body portion integrally having an output-side surface portion including a plurality of first through-holes, through each of which the respective output-side bearing holder is inserted, a counter-output-side surface portion including a plurality of second through-holes, through each of which the respective counter-output-side bearing holder is inserted, and a coupling portion that couples the output-side surface portion and the counter-output-side surface portion;
      a flange facing the output-side surface portion to support an output-side end portion of each of the output-side bearing holders; and
      a bracket facing the counter-output-side surface portion to support a counter-output-side end portion of each of the counter-output-side bearing holders.

2. The linear head module according to claim 1, wherein the flange is provided with first insertion holes, through each of which the respective output member is inserted, and a contact portion with which an output-side end surface of each of the output-side bearing holders comes into contact.

3. The linear head module according to claim 1, wherein the output-side bearing holder includes a first large-diameter portion on an output side, and a first small-diameter portion on a counter-output side,
   the first large-diameter portion is inserted in the first through-hole of the output-side surface portion, and
   the first small-diameter portion is fitted in the output-side end portion of the back yoke.

4. The linear head module according to claim 1, wherein the counter-output-side bearing holder includes:
   a back yoke coupling portion on an output side, coupled to the back yoke;
   a second small-diameter portion on a counter-output side, fitting on the bracket; and
   a second large-diameter portion between the back yoke coupling portion and the second small-diameter portion, the second large-diameter portion having a larger diameter than the second small-diameter portion.

5. The linear head module according to claim 4, wherein the bracket is provided with second insertion holes, through each of which the respective output member penetrates,
   a radially inner end portion of a wall surface forming the second insertion hole is provided with a fitting portion extending toward the output side, and
   the fitting portion fits on a counter-output-side end portion of the second small-diameter portion that extends toward the counter-output side through the second through-hole.

6. The linear head module according to claim 1, wherein the stator includes the coil, a board that supplies power to the coil and controls the coil, the cylindrical back yoke where the coil is housed, and a plate-shaped cover provided on an outer peripheral side of the cylindrical back yoke to house the board,
   the first through-hole of the output-side surface portion has a circular shape that allows the cylindrical back yoke to be inserted therethrough, and
   the second through-hole of the counter-output-side surface portion has a shape that allows the back yoke and the cover to be inserted therethrough.

* * * * *